United States Patent
Payne et al.

(10) Patent No.: US 8,513,980 B2
(45) Date of Patent: Aug. 20, 2013

(54) REDUCED OFFSET COMPARATOR

(75) Inventors: Robert F. Payne, Lucas, TX (US);
Baher S. Haroun, Allen, TX (US)

(73) Assignee: Texas Instruments Incorporated,
Dallas, TX (US)

( * ) Notice: Subject to any disclaimer, the term of this patent is extended or adjusted under 35 U.S.C. 154(b) by 0 days.

(21) Appl. No.: 13/281,227

(22) Filed: Oct. 25, 2011

(65) Prior Publication Data

US 2013/0099824 A1    Apr. 25, 2013

(51) Int. Cl.
*H03K 5/22*    (2006.01)

(52) U.S. Cl.
USPC ............... 327/69; 327/70; 327/65; 327/403; 327/407; 327/99

(58) Field of Classification Search
USPC .............. 327/65, 67, 68, 69, 70, 71, 74, 75, 327/403, 404, 405, 407, 408, 411, 99
See application file for complete search history.

(56) References Cited

U.S. PATENT DOCUMENTS

| | | | | |
|---|---|---|---|---|
| 3,614,327 A * | 10/1971 | Low et al. | ...................... | 370/216 |
| 4,403,330 A * | 9/1983 | Meyer | ............................ | 375/214 |
| 5,191,234 A * | 3/1993 | Murakami et al. | ............ | 327/172 |
| 5,243,599 A * | 9/1993 | Barrett et al. | .................. | 370/541 |
| 5,744,995 A * | 4/1998 | Young | ............................ | 327/407 |
| 7,474,129 B2 | 1/2009 | Carey | | |
| 7,688,112 B2 * | 3/2010 | Katzman et al. | ................ | 326/82 |
| 8,120,209 B2 * | 2/2012 | Tanaka et al. | .................. | 307/115 |
| 2006/0250165 A1 * | 11/2006 | Carey | .............................. | 327/65 |
| 2012/0119790 A1 * | 5/2012 | Chen | ............................... | 327/65 |

* cited by examiner

*Primary Examiner* — Lincoln Donovan
*Assistant Examiner* — Jung H. Kim
(74) *Attorney, Agent, or Firm* — Alan A. R. Cooper; Wade J. Brady, III; Frederick J. Telecky, Jr.

(57) ABSTRACT

An apparatus is provided. The apparatus comprises backend circuitry and pairs of redundant input circuits. Each pair of redundant input circuits is configured to form a differential pair of transistors, and each redundant input circuit includes a multiplexer and a set of transistors. The multiplexer is coupled to the backend circuitry, and each transistor from the set of transistors has a first passive electrode, a second passive electrode, and a control electrode. The first passive electrode of each transistor from the set of transistors is coupled to the multiplexer, and the control electrodes from the set of transistors are coupled together.

17 Claims, 4 Drawing Sheets

REDUCED OFFSET COMPARATOR

TECHNICAL FIELD

The invention relates generally to a comparator and, more particularly, to a comparator with offset compensation.

BACKGROUND

In many high performance applications, precise comparisons of two (or more signals) is conducted. As a results of process variation (during manufacturing) as well as other factors, there can be transistor mismatches that result in an input offset or offset voltage. In conventional systems (such as system 100) of FIG. 1, compensation for offset was accomplished by providing multiple, substantially identical comparators 102-1 to 102-N in parallel with one another. Based on testing of these comparators 102-1 to 102-N, the "best" comparator (of comparators 102-1 to 102-N) can be selected by application of a select signal to multiplexer or mux 104. This configuration, however, can waste a significant amount of area because the majority of comparators 102-1 to 102-N are unused.

To illustrate this point, a plot showing 10 simulation trials for 1000 comparators in a 7 comparator array (which, for example, can be used with a 3-bit flash comparator) with the worst-case offset for each trial being recorded can be in FIG. 2. For these trials, 7 comparators were chosen from sets having 0 (7pick7) to 5 (12pick7) redundant comparators. The redundancy does indeed help reduce the worst-case offset, but a point of diminishing returns is quickly reached, as the set with 4 redundant comparators (11pick7) has a similar worst-case offset to the set with 5 redundant comparators (12pick7). Additionally, with 5 redundant comparators, the extra area overhead is 71%. Thus, there is a need for an improved comparator having a reduced offset.

Another example of a conventional circuit is U.S. Pat. No. 7,474,129.

SUMMARY

An embodiment of the present invention, accordingly, provides an apparatus. The apparatus comprises backend circuitry; a plurality of pairs of redundant input circuits, wherein each pair of redundant input circuits is configured to form a differential pair of transistors, and wherein each redundant input circuit includes: a multiplexer that is coupled to the backend circuitry; and a set of transistors, wherein each transistor from the set of transistors has a first passive electrode, a second passive electrode, and a control electrode, and wherein the first passive electrode of each transistor from the set of transistors is coupled to the multiplexer, and wherein the control electrodes from the set of transistors are coupled together.

In accordance with an embodiment of the present invention, the set of transistors further comprises a first transistor and a second transistor.

In accordance with an embodiment of the present invention, the multiplexer further comprises: a node; a first switch that is coupled between the first transistor of the set of transistors and the input node; a second switch that is coupled between the second transistor of the set of transistors and the input node; and a control circuit that is configured to receive a select signal and that is configured to control the first and second switches.

In accordance with an embodiment of the present invention, the first and second switches further comprise first and second PMOS transistors, respectively, and wherein the multiplexer further comprises: a first NMOS transistor that is coupled to the control electrode of the first transistor of the set of transistors at its drain and that is coupled to the control circuit at its gate; and a second NMOS transistor that is coupled to the that is coupled to the control electrode of the second transistor of the set of transistors at its drain and that is coupled to the control circuit at its gate.

In accordance with an embodiment of the present invention, the control circuit further comprises an inverter that is coupled to the gates of the second PMOS transistor and the second NMOS transistor, and wherein the gates of the first PMOS transistor and first NMOS transistor are configured to receive the select signal.

In accordance with an embodiment of the present invention, the inverter further comprises a first inverter, and wherein the backend circuitry further comprises: a pair of cross-coupled PMOS transistors; a pair of cross-coupled NMOS transistors that is coupled to the pair of cross-coupled PMOS transistors and that is coupled to each multiplexer; a second inverter that is the pairs of cross-coupled PMOS and NMOS transistors; and a third inverter that is the pairs of cross-coupled PMOS and NMOS transistors.

In accordance with an embodiment of the present invention, the node receives a bias voltage, and wherein the multiplexer further comprises: a first cascoded transistor that is coupled to the first PMOS transistor and the first transistor of the set of transistors; and a second cascoded transistor that is coupled to the second PMOS transistor and the second transistor of the set of transistors.

In accordance with an embodiment of the present invention, the first PMOS transistor is coupled to the control electrode of the first transistor of the set of transistors, and wherein the second PMOS transistor is coupled to the control electrode of the second transistor of the set of transistors.

In accordance with an embodiment of the present invention, each transistor from the set of transistors is an NMOS transistor.

In accordance with an embodiment of the present invention, each transistor from the set of transistors is an NPN transistor.

In accordance with an embodiment of the present invention, an apparatus is provided. The apparatus comprises backend circuitry; a first redundant input circuit having: a first multiplexer that is coupled to the backend circuitry; and a first set of transistors, wherein each transistor from the first set of transistors has a first passive electrode, a second passive electrode, and a control electrode, and wherein the first passive electrode of each transistor from the first set of transistors is coupled to the first multiplexer, and wherein the control electrodes from the first set of transistors are coupled together; and a second redundant input circuit having: a second multiplexer that is coupled to the backend circuitry; and a second set of transistors, wherein each transistor from the second set of transistors has a first passive electrode, a second passive electrode, and a control electrode, and wherein the first passive electrode of each transistor from the second set of transistors is coupled to the second multiplexer, and wherein the control electrodes from the second set of transistors are coupled together.

In accordance with an embodiment of the present invention, the first set of transistors further comprises a first transistor and a second transistor, and wherein the second set of transistors further comprises a third transistor and a fourth transistor.

In accordance with an embodiment of the present invention, the first multiplexer further comprises: a first node; a first PMOS transistor that is coupled between the first transistor and the first node; a second PMOS that is coupled between the second transistor and the first node; a first NMOS transistor that is coupled to the source of the first PMOS transistor at its drain; a second NMOS transistor that is coupled to the that is coupled to source of the second PMOS transistor at its drain; and a first control circuit that is configured to receive a first select signal and that is coupled to the gates of the first and second PMOS transistors and the first and second NMOS transistors.

In accordance with an embodiment of the present invention, the second multiplexer further comprises: a second node; a third PMOS transistor that is coupled between the control electrode of the second transistor of the second set of transistors and the second node; a fourth PMOS that is coupled between the control electrode of the second transistor of the second set of transistors and the second node; a third NMOS transistor that is coupled to the source of the third PMOS transistor at its drain; a fourth NMOS transistor that is coupled to the source of the fourth PMOS transistor at its drain; and a second control circuit that is configured to receive a second select signal and that is coupled to the gates of the third and fourth PMOS transistors and the third and fourth NMOS transistors.

In accordance with an embodiment of the present invention, the backend circuitry further comprises: a pair of cross-coupled PMOS transistors; a pair of cross-coupled NMOS transistors that is coupled to the pair of cross-coupled PMOS transistors and that is coupled to the first and second multiplexers; a first inverter that is the pairs of cross-coupled PMOS and NMOS transistors; and a second inverter that is the pairs of cross-coupled PMOS and NMOS transistors.

In accordance with an embodiment of the present invention, the first and second nodes receive a bias voltage, and wherein the first multiplexer further comprises: a first cascoded transistor that is coupled to the first PMOS transistor; and a second cascoded transistor that is coupled to the second PMOS transistor; and wherein the second multiplexer further comprises: a third cascoded transistor that is coupled to the third PMOS transistor; and a fourth cascoded transistor that is coupled to the fourth PMOS transistor.

In accordance with an embodiment of the present invention, the first PMOS transistor is coupled to the control electrode of the first transistor, and wherein the second PMOS transistor is coupled to the control electrode of the second transistor.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
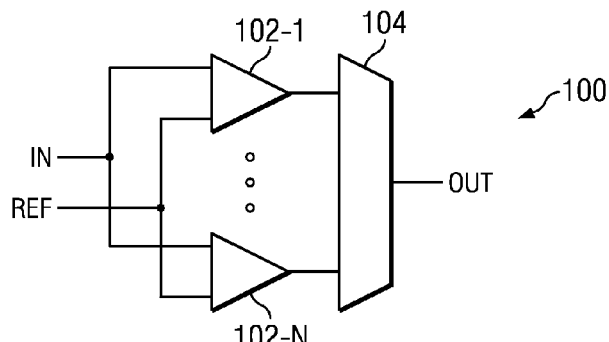
FIG. 1 is a diagram of a conventional system.

Refer now to the drawings wherein depicted elements are, for the sake of clarity, not necessarily shown to scale and wherein like or similar elements are designated by the same reference numeral through the several views.

Figure 3:
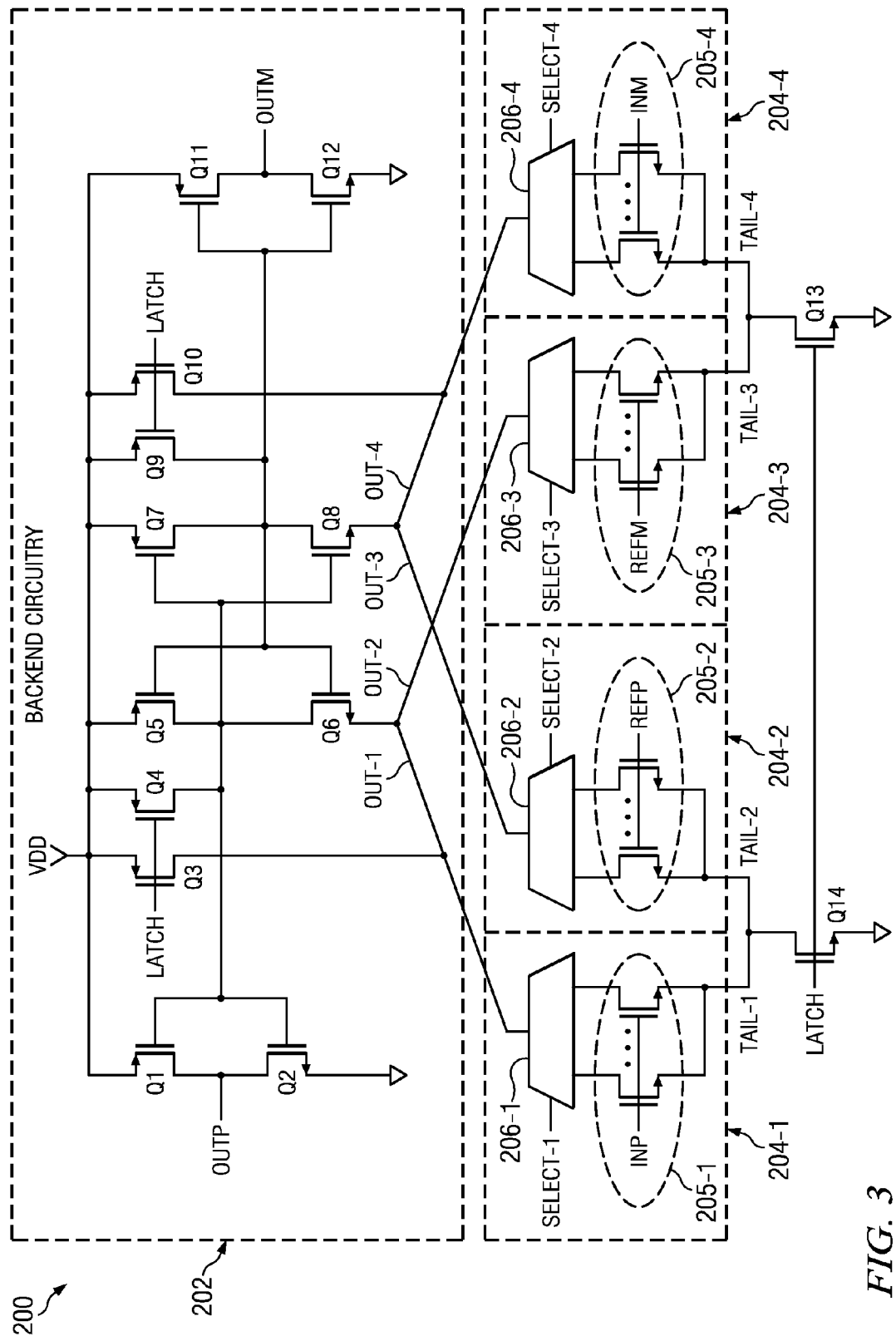
FIG. 3 is a diagram of an example of a comparator in accordance with an embodiment of the present invention.

Turning to FIG. 3, an example of a comparator 200 in accordance with an embodiment of the present invention can be seen. This comparator 200 generally functions as a latched comparator that receives a differential input signal INM and INP and reference voltages RFEM and REFP and that is controlled (latched) by latch signal LATCH. As shown, the comparator 200 generally includes backend circuitry 202 (which is generally configured to produce a differential comparison results OUTM and OUTP), redundant input circuits 204-1 to 204-4 (four are shown here for the sake of simplicity), and transistors Q13 and Q14 (which are controlled by latch signals LATCH and provide tail currents TAIL-1 to TAIL-4). The redundant input circuits 204-1 to 204-2 are arranged in pairs 204-1/204-4 and 204-2/204-3 to form differential pairs that receive complementary signals INP/INM and REFP/REFM and provide signals OUT-1 to OUT-4. These complementary signals INP/INM and REFP/REFM are applied to the gates (or bases if the transistors are bipolar) of the transistors within sets 205-1 to 205-4, and, based on measurements, the "best" (namely, providing the lowest offset) transistors can be selected by muxes 206-1 to 206-4 with select signals SELECT-1 to SELECT-4. The outputs from the muxes 206-1 to 206-4 are then applied to the pairs of cross-coupled transistors Q5 to Q7 (which generally include a pair of cross-coupled PMOS transistors Q5 and Q7 and a pair of cross-coupled NMOS transistors Q6 and Q8). These cross-coupled transistors Q5 to Q7 in conjunction with transistors Q3, Q4, Q9, and Q10 (which each receive latch signal LATCH) generally operate as a latch and are coupled to inverters (which generally comprise transistors Q1/Q2 and Q11/Q12) that provide the comparison results OUTP and OUTM. For the comparator 200 that employs the redundant input circuit 204, outputs OUTP and OUTM are +1 and −1, respectively, if difference between signals INP and INM (i.e., INP-INM) is greater that the difference between signals REFP and REFM (i.e., REFP-REFM) and −1/+1 if not. By replacing each input transistor with two transistors as shown in this example, it is possible that 16 (or $2^4$) different combinations of input devices are available. By searching these 16 combinations, it is straightforward to find the combination that provides the lowest possible offset, yielding 16 redundant comparators.

Figure 4:
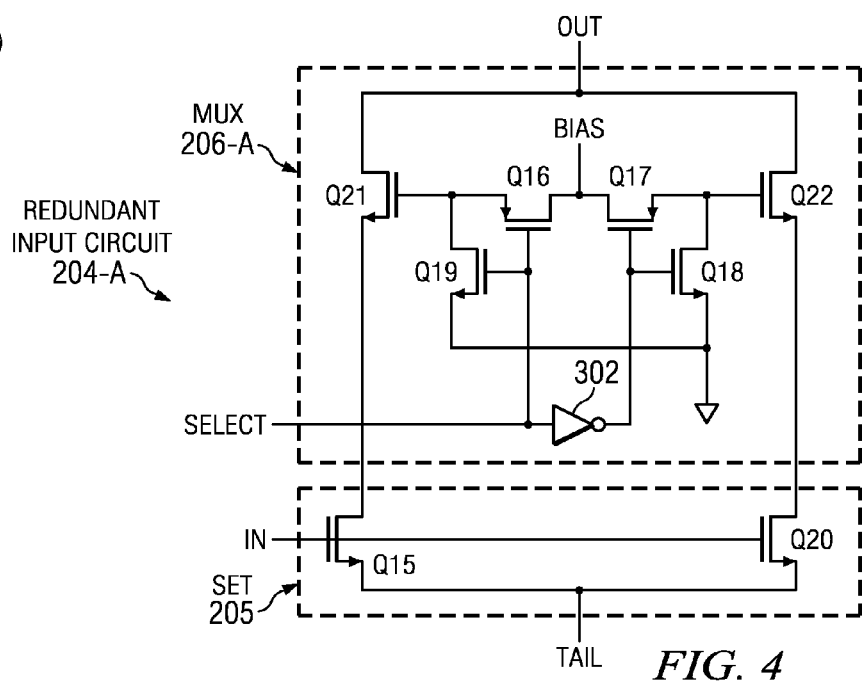
FIGS. 4 and 5 are diagrams of examples of the redundant input circuit of FIG. 2.

In FIG. 4, a more detailed example of redundant input circuits 204-1 to 204-4 (hereinafter 204-A) can be seen. In this example, the set 205 is generally comprised of transistors Q15 and Q20, which can be CMOS transistors (i.e., NMOS) or bipolar transistors (i.e., NPN). The mux 206-A is generally comprised of transistors Q16 to Q19 (which are, for example, PMOS and NMOS transistors and which can operate as switches), transistors Q21 and Q22 (which can be NPN or NMOS transistors), and inverter 302 (which generally operates as a control circuit for transistors Q16 to Q19 and which receives a select signal SELECT). When the select signal is logic high or "1", the bias voltage BIAS is supplied to transistor Q21 (which is cascoded with transistor Q15) through transistor Q16, turning on transistor Q21 so that transistor Q15 is selected. When the select signal is logic low or "0", the bias voltage BIAS is supplied to transistor Q22 (which is cascoded with transistor Q20) through transistor Q17, turning on transistor Q22 so that transistor Q20 is selected.

Figure 5:
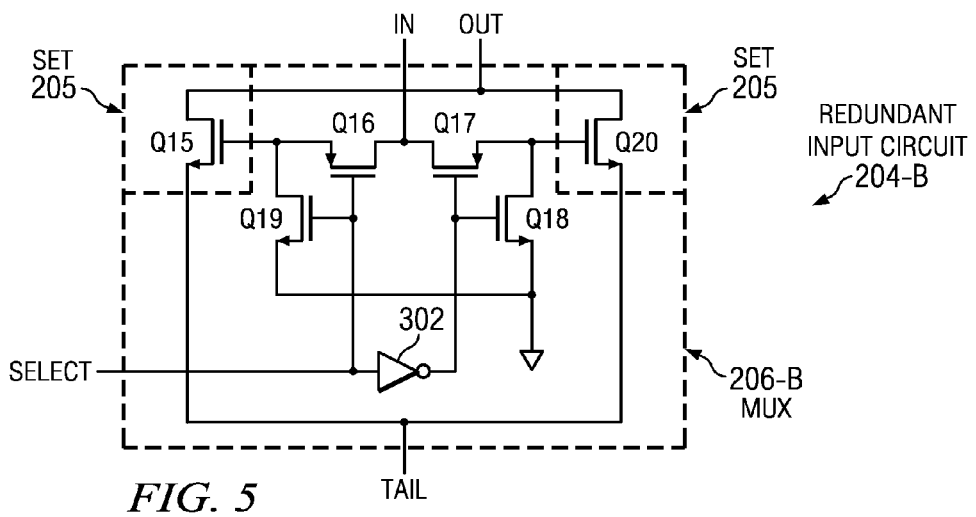
Figure 2:
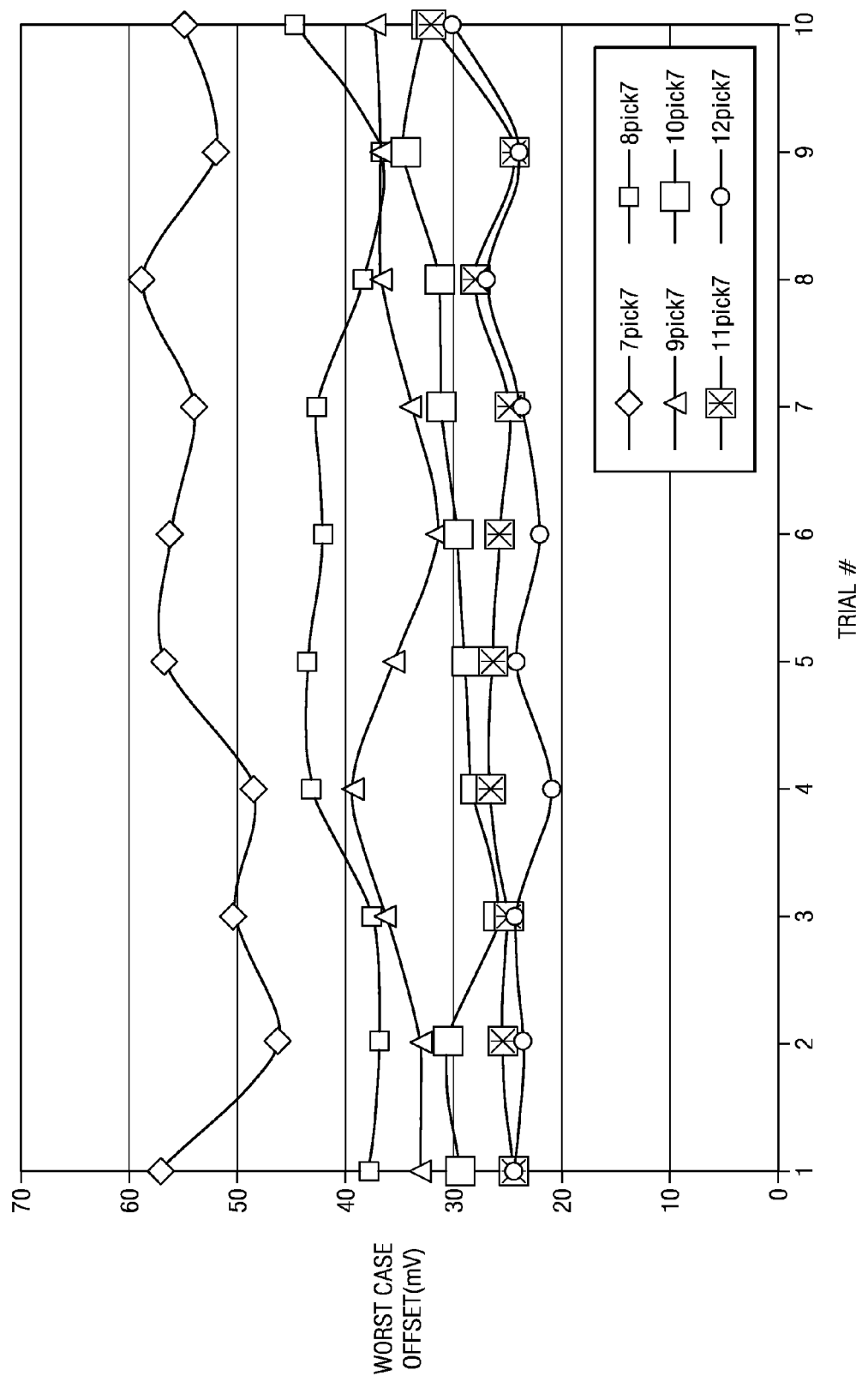
FIG. 2 is a diagram of comparative simulation results for the system of FIG. 1.

In FIG. 5, another example of redundant input circuits 204-1 to 204-4 (hereinafter 204-B) can be seen. In this arrangement, transistors Q21 and Q22 are replaced in mux 206-B with transistors Q15 and Q20 and the input IN (which can correspond to one of signals INP and INM) is provided to the node between transistors Q16 and Q17, so, instead of activating a cascoded transistor (i.e., transistor Q21 or Q22), transistor Q16 or Q17 is in the signal path to transistor Q15 or Q20, respectively.

Figure 6:
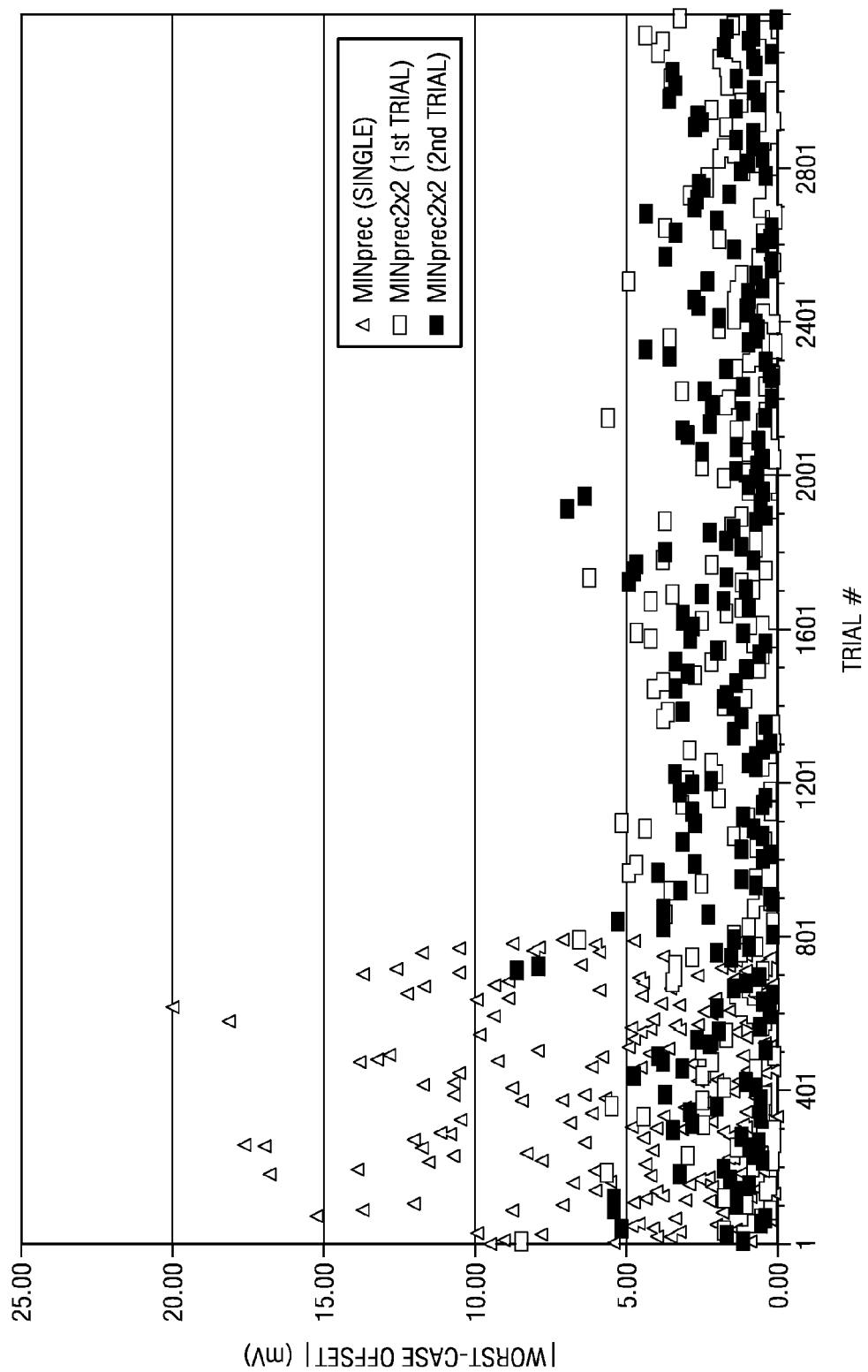
FIG. 6 is a diagram of comparative simulation results employing the comparator of FIG. 3.

Turning to FIG. 6, a plot illustrating the power of redundant input transistors. In this plot, three data series are visible. In each series, 200 monte carlo SPICE simulation trials were performed. The first data series (MINprec (single)) shows the impact of 2 redundant transistors on the VREFP and VREFM inputs. This addition reduced the achievable offset to approximately 20 mV. For this case, a total of 800 trials were simulated, corresponding to the 4 combinations of input transistor chosen. The next two data series highlight the impact of providing a total of 4 redundant transistors, where redundant transistors for the INP and INM inputs are added. For this very slight increase in area and complexity (however, no power increase), the achievable offset is less than 8.5 mV.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   backend circuitry;
   a plurality of pairs of redundant input circuits, wherein each pair of redundant input circuits is configured to form a differential pair of transistors, and wherein each redundant input circuit includes:
      a multiplexer that is coupled to the backend circuitry; and
      a set of transistors, wherein each transistor from the set of transistors has a first passive electrode, a second passive electrode, and a control electrode, and wherein the first passive electrode of each transistor from the set of transistors is coupled to the multiplexer, and wherein the control electrodes from the set of transistors are coupled together.

2. The apparatus of claim 1, the set of transistors further comprises a first transistor and a second transistor.

3. The apparatus of claim 2, wherein the multiplexer further comprises:
   an input node;
   a first switch that is coupled between the first transistor of the set of transistors and the input node;
   a second switch that is coupled between the second transistor of the set of transistors and the input node; and
   a control circuit that is configured to receive a select signal and that is configured to control the first and second switches.

4. The apparatus of claim 3, wherein the first and second switches further comprise first and second PMOS transistors, respectively, and wherein the multiplexer further comprises:
   a first NMOS transistor that is coupled to the control electrode of the first transistor of the set of transistors at its drain and that is coupled to the control circuit at its gate; and
   a second NMOS transistor that is coupled to the control electrode of the second transistor of the set of transistors at its drain and that is coupled to the control circuit at its gate.

5. The apparatus of claim 4, wherein the control circuit further comprises an inverter that is coupled to the gates of the second PMOS transistor and the second NMOS transistor, and wherein the gates of the first PMOS transistor and first NMOS transistor are configured to receive the select signal.

6. The apparatus of claim 5, wherein the inverter further comprises a first inverter, and wherein the backend circuitry further comprises:
   a pair of cross-coupled PMOS transistors;
   a pair of cross-coupled NMOS transistors that is coupled to the pair of cross-coupled PMOS transistors and that is coupled to each multiplexer;
   a second inverter that is coupled to the pairs of cross-coupled PMOS and NMOS transistors; and
   a third inverter that is coupled to the pairs of cross-coupled PMOS and NMOS transistors.

7. The apparatus of claim 6, wherein the node receives a bias voltage, and wherein the multiplexer further comprises:
   a first cascoded transistor that is coupled to the first PMOS transistor and the first transistor of the set of transistors; and
   a second cascoded transistor that is coupled to the second PMOS transistor and the second transistor of the set of transistors.

8. The apparatus of claim 6, wherein the first PMOS transistor is coupled to the control electrode of the first transistor of the set of transistors, and wherein the second PMOS transistor is coupled to the control electrode of the second transistor of the set of transistors.

9. The apparatus of claim 6, wherein each transistor from the set of transistors is an NMOS transistor.

10. The apparatus of claim 6, wherein each transistor from the set of transistors is an NPN transistor.

11. An apparatus comprising:
    backend circuitry;
    a first redundant input circuit having:
       a first multiplexer that is coupled to the backend circuitry; and
       a first set of transistors, wherein each transistor from the first set of transistors has a first passive electrode, a second passive electrode, and a control electrode, and wherein the first passive electrode of each transistor from the first set of transistors is coupled to the first multiplexer, and wherein the control electrodes from the first set of transistors are coupled together; and
    a second redundant input circuit having:
       a second multiplexer that is coupled to the backend circuitry; and
       a second set of transistors, wherein each transistor from the second set of transistors has a first passive electrode, a second passive electrode, and a control electrode, and wherein the first passive electrode of each transistor from the second set of transistors is coupled to the second multiplexer, and wherein the control electrodes from the second set of transistors are coupled together.

wherein the first set of transistors further comprises a first transistor and a second transistor, and wherein the second set of transistors further comprises a third transistor and a fourth transistor, wherein the first multiplexer further comprises:
- a first node;
- a first PMOS transistor that is coupled between the first transistor and the first node;
- a second PMOS that is coupled between the second transistor and the first node;
- a first NMOS transistor that is coupled to the source of the first PMOS transistor at its drain;
- a second NMOS transistor that is coupled to the that is coupled to source of the second PMOS transistor at its drain; and
- a first control circuit that is configured to receive a first select signal and that is coupled to the gates of the first and second PMOS transistors and the first and second NMOS transistors.

12. The apparatus of claim 11, wherein the second multiplexer further comprises:
- a second node;
- a third PMOS transistor that is coupled between the control electrode of the second transistor of the second set of transistors and the second node;
- a fourth PMOS that is coupled between the control electrode of the second transistor of the second set of transistors and the second node;
- a third NMOS transistor that is coupled to the source of the third PMOS transistor at its drain;
- a fourth NMOS transistor that is coupled to the source of the fourth PMOS transistor at its drain; and
- a second control circuit that is configured to receive a second select signal and that is coupled to the gates of the third and fourth PMOS transistors and the third and fourth NMOS transistors.

13. The apparatus of claim 12, wherein the backend circuitry further comprises:
- a pair of cross-coupled PMOS transistors;
- a pair of cross-coupled NMOS transistors that is coupled to the pair of cross-coupled PMOS transistors and that is coupled to the first and second multiplexers;
- a first inverter that is coupled to the pairs of cross-coupled PMOS and NMOS transistors; and
- a second inverter that is coupled to the pairs of cross-coupled PMOS and NMOS transistors.

14. The apparatus of claim 13, wherein the first and second nodes receive a bias voltage, and
wherein the first multiplexer further comprises:
- a first cascoded transistor that is coupled to the first PMOS transistor; and
- a second cascoded transistor that is coupled to the second PMOS transistor; and wherein the second multiplexer further comprises:
- a third cascoded transistor that is coupled to the third PMOS transistor; and
- a fourth cascoded transistor that is coupled to the fourth PMOS transistor.

15. The apparatus of claim 13, wherein the first PMOS transistor is coupled to the control electrode of the first transistor, and wherein the second PMOS transistor is coupled to the control electrode of the second transistor.

16. The apparatus of claim 13, wherein each transistor from the first and second sets of transistors is an NMOS transistor.

17. The apparatus of claim 13, wherein each transistor from the first and second sets of transistors further is an NPN transistor.

* * * * *